United States Patent [19]
Thomas

[11] Patent Number: 5,113,192
[45] Date of Patent: May 12, 1992

[54] METHOD FOR USING SEISMIC DATA ACQUISITION TECHNOLOGY FOR ACQUISITION OF GROUND PENETRATING RADAR DATA

[75] Inventor: Bobby J. Thomas, Ponca City, Okla.

[73] Assignee: Conoco Inc., Ponca City, Okla.

[21] Appl. No.: 695,170

[22] Filed: May 3, 1991

[51] Int. Cl.⁵ .......................... G01S 7/34; G01V 1/28
[52] U.S. Cl. ........................................ 342/22; 342/92; 367/67
[58] Field of Search .................... 342/22, 92, 197; 367/65, 67

[56] References Cited

U.S. PATENT DOCUMENTS

| | | | |
|---|---|---|---|
| 3,919,685 | 11/1975 | Haill | 367/65 X |
| 3,967,282 | 6/1976 | Young et al. | 342/22 |
| 4,008,469 | 2/1977 | Chapman | 342/22 |
| 4,218,678 | 8/1980 | Fowler et al. | 367/37 X |
| 4,245,191 | 1/1981 | Schroeder | 342/22 X |
| 4,258,321 | 3/1981 | Neale, Jr. | 324/334 |
| 4,430,653 | 2/1984 | Coon et al. | 342/22 |
| 4,504,833 | 3/1985 | Fowler et al. | 342/22 |
| 4,544,892 | 10/1985 | Kaufman et al. | 324/334 |

Primary Examiner—Gilberto Barron, Jr.

[57] ABSTRACT

A method and apparatus are used in the acquisition of data by ground-penetrating radar, wherein the signals thus obtained are input to a pre-amplifier which contains filtering component such as an anti-aliasing filter. The base gain of the system is switch selectable and electronically adjusted to bring the input signal to between one half and full scale on an analog to digital converter input. The converted digital value has a resolution of fifteen bits for processing.

11 Claims, 2 Drawing Sheets

METHOD FOR USING SEISMIC DATA ACQUISITION TECHNOLOGY FOR ACQUISITION OF GROUND PENETRATING RADAR DATA

BACKGROUND OF THE INVENTION

1. Field of the Invention

The present invention pertains to ground penetrating radar (GPR) data acquisition and more particularly to acquiring ground penetrating radar data through the use of seismic data acquisition technology to obtain more accurate relative amplitude information.

2. Related Prior Art

Prior art has demonstrated many methods for using various types of generated electromagnetic waves to penetrate the earth's surface. Many of these contain methods and apparatus for receiving the reflected waves and obtaining limited information. The most prevalent use of waves of the nature of radar are to locate solid objects that are located at some point below the surface. However, prior art has provided some insights into the use of radar to locate subsurface anomalies. The following patents are relevant in their illustration of the use of electromagnetic waves to acquire subsurface information.

U.S. Pat. No. 3,967,282, "Underground Pipe Detector", (Young, et. al.), relates to an apparatus and method wherein an electrical impulse source transmits a radar type signal through an antenna into the ground and is reflected by a target. The reflected signal or echo is detected by the antenna and an analog to digital converter converts it to a digital form which may be readily operated on, stored and recalled. A memory stores the information until recalled for comparison with a subsequent signal. A processing means compares the stored and subsequent signal to give an indication of the location of metallic and non-metallic buried targets.

U.S. Pat. No. 4,008,469, "Signal Processing in Short-Pulse Geophysical Radar System", (Chapman), relates to signal processing techniques and apparatus for use in short pulse geophysical radar systems to improve signal to noise ratio, reduce r.f. interference, improve resolution, and reduce ambiguities.

U.S. Pat. No. 4,218,678, "Synthetic Pulse Radar Including A Microprocessor Based Controller", (Fowler, et al.), relates to pulse radar detection of targets in extended media, including natural phenomena such as oil, coal, and ore deposits within the earth. In particular, this invention relates to a pulse radar system employing a synthetic pulse formed from a Fourier spectrum of frequencies generated and detected by a digitally controlled transmitter and receiver circuits.

U.S. Pat. No. 4,245,191, "Method and Apparatus for Detecting and Measuring Inclusions in Subsoil", (Schroeder), relates to a method and apparatus comprising a transmitter for transmitting an unmodulated carrier of selected wave length into the ground and a receiver adapted to receive reflected signals. Circuitry is described for producing narrow pulses from the transmitted and received signals for displaying them on an oscilloscope and on a plotter. The display on the oscilloscope is rotated through ninety degrees from the conventional display so that the pulses corresponding to the transmitted and reflected signals appear as horizontal bars spaced apart vertically by distances which correspond to the depth of the inclusions below the surface. The wave length is selected to be at least four times the anticipated depth of the inclusions.

The apparatus is described as being incorporated into a motor vehicle such as a Land Rover with the transmitting antenna mounted at the front and receiving antenna at the rear of the vehicle. The apparatus is most conveniently situated in place of the co-driver's seat for operation by an operator sitting in the rear of the vehicle. Decoupling between transmitting and receiving antennae is partially achieved due to the rotation through ninety degrees of the polarity of the reflected wave relative to the transmitted wave.

U.S. Pat. No. 4,258,321, "Radio Geophysical Surveying Method and Apparatus", (Neale), relates to a method and apparatus for radio geophysical surveying and includes measuring the relative magnitude and phase of radio frequency signal components reflected from subterranean formations. The apparatus comprises a transmitter selectively connected to a vertical antenna and a loop antenna. Also included is a pair of receivers, one receiver being connected to a vertical antenna and the other to a loop antenna. A surface propagated calibration signal is transmitted and is received by each of the receivers. The outputs of the receivers are connected to the input of a difference amplifier, a difference signal is generated, and the magnitude and phase of the difference signal are measured and recorded. A survey signal, including surface propagated components and earth propagated components, is then transmitted. The survey signal is received, a difference signal is generated, and the magnitude and phase thereof are measured. For each position along the survey path, the calibration magnitude and phase are vectorially subtracted form the corresponding survey magnitude and phase, and the resultant magnitude and phase are plotted. At each position, the data is taken for an electric field vector alignment of the transmitter and receiver loop antennas, and for a magnetic field vector alignment thereof. The transmitter and receivers include means for precisely maintaining consistency throughout the survey.

U.S. Pat. No. 4,430,653, "Earth Probing Radar System", (Coon, et al.), relates to a ground probing radar method and apparatus which is used to view the earth in advance of coal mining activity and provides visual display of a coal seam and particular discontinuities that may lie therein. The system operates in the frequency range of 10 Megahertz to 5 Gigahertz. The received electromagnetic energy is amplified, sampled and band pass filtered with subsequent time gain amplification. A time analog return signal may be viewed directly and/or the return signal may be digitally processed to enable further signal refinement. A control microprocessor is utilized for both tape record control and digital signal processing. The processor includes the capability for compositing and/or stacking of common source point data for output record and display.

U.S. Pat. No. 4,504,833, "Synthetic Pulse Radar System and Method", (Fowler, et al.), relates to a method and apparatus for detecting geophysical phenomena by the use of a synthetic pulse radar. A radar transmitter generates a plurality of component signals of different frequencies which approximate at least a portion of the Fourier transform of a radar short pulse. These component signals are transmitted simultaneously for modulation by the geophysical phenomena, and the modulated component signals are substantially simultaneously received in a receiver. The receiver divides the components signals, and as to each determines representative parameters. This patent also includes a heterodyne receiver which operates with a fixed IF frequency and incorporates a single frequency quadrature system.

U.S. Pat. No. 4,544,892, "Signal Processing Apparatus for Frequency Domain Geophysical Electromagnetic Surveying System", (Kaufman, et al.), relates to a frequency domain geophysical electromagnetic surveying system in which intermittent primary fields having sharp terminations are generated in a cycle having a fundamental frequency by a transmitter. A receiver includes a gate passing only secondary signals received during interruptions of the primary field, the gated signal being applied to filters tuned to harmonics of the predetermined frequency. The filter outputs are synchronously demodulated to provide signals corresponding to at least the in phase component of the secondary signal at the fundamental frequency, and preferably in phase and quadrature components of at least two harmonics.

SUMMARY OF THE INVENTION

The present invention provides a method and apparatus used in the acquisition of data by ground penetrating radar. The signals obtained by the generation of radar into the earth are input to a pre-amplifier which contains filtering components such as an anti-aliasing filter. The base gain of the system is switch selectable and the final gain is electronically adjusted to bring the input signal to between one half and full scale on an analog to digital converter input. The converted digital value has a resolution of fifteen bits for processing. In this manner, ground penetrating radar can be used efficiently to provide a new dimension in shallow stratigraphy applications. The signals received when using ground penetrating radar are similar from those received in seismic prospecting with conventional seismic acoustic pulses or waves, allowing the use of current seismic processing techniques for signal improvement.

DESCRIPTION OF THE PREFERRED EMBODIMENT

Ground Penetrating Radar (GPR) is becoming an important tool in environmental and other shallow stratigraphy applications. Ground penetrating radar data is very similar to seismic data. As a result, it has the same potential of improvement when processed by current seismic processing techniques. To realize this potential processing improvement, the ground penetrating radar field data quality needs to be improved. The present application discusses ground penetrating radar hardware, its deficiencies, while the present invention discloses the hardware used to improve the quality of data associated with ground penetrating radar. These improvements are achieved by modifying and adapting seismic data acquisition hardware to ground penetrating radar data acquisition.

Figure 1:
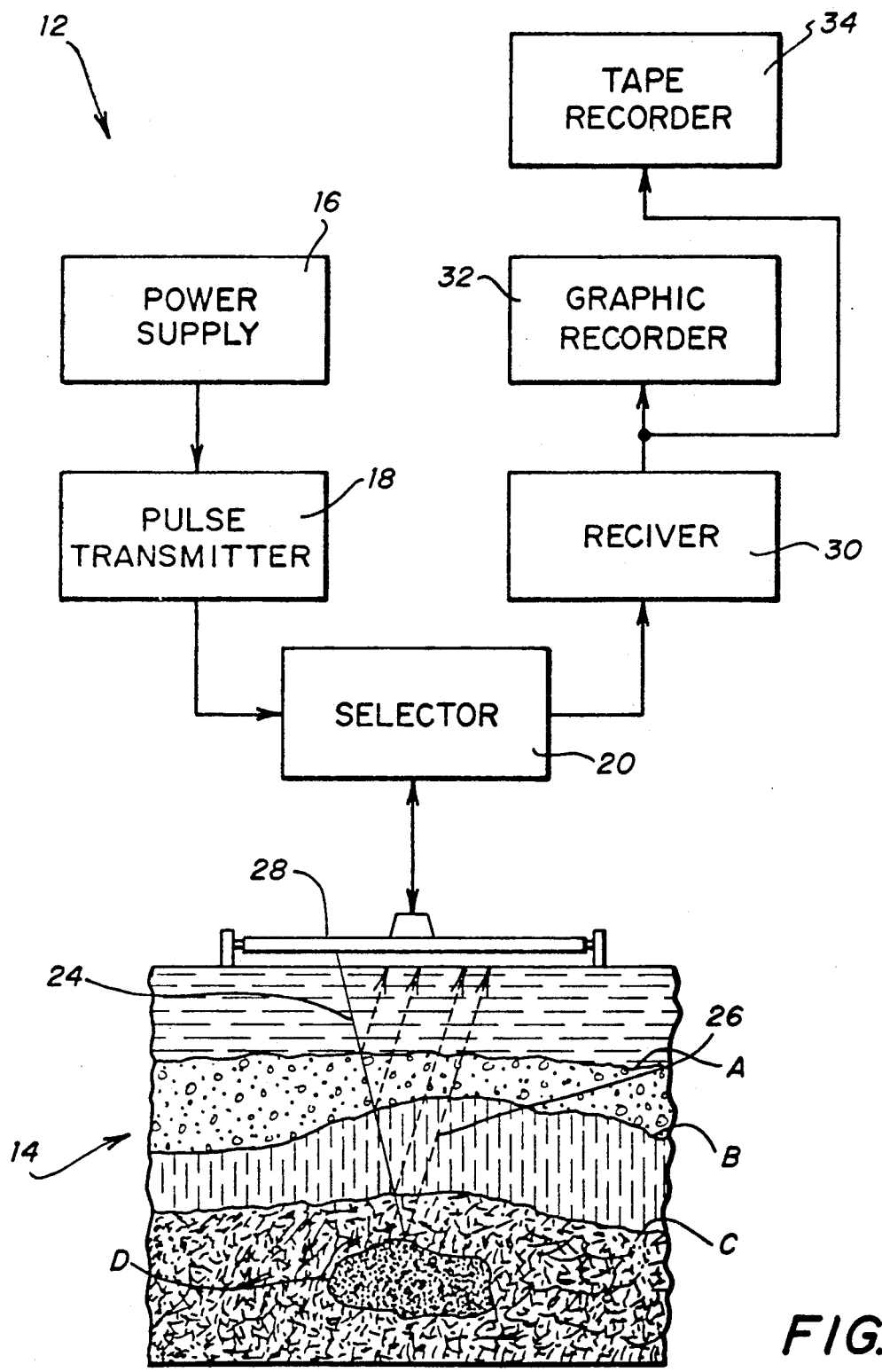
FIG. 1 is a block diagram of a ground penetrating radar system illustrated with a plan view of subsurface formations being investigated.

FIG. 1 shows a block diagram of a ground penetrating radar system 12 with an illustration of the subsurface formations 14 likely to be encountered. A power supply 16 is illustrated as providing the input to a pulse transmitter 18. A selector 20 is illustrated as connected to antenna 22. Transmitter 18 generates repetitive short time duration electromagnetic pulses 24 which are radiated into the ground through an antenna 22. A reflected signal 26 is returned by antenna 22 to a receiver 30, where it is filtered and amplified (see FIG. 2). In the preferred embodiment, antenna 24 is used to transmit electromagnetic pulses and receive the reflected signal, controlled by selector 20. Selector 20 is preferably an electronic switch currently available in the art. However, different antenna may be used to transmit and receive the radar signal. Reflected signal 26 is normally displayed on a graphic recorder 32 for final record. However, an option to digitize and store this data on cassette tape on tape recorder 34 directly from receiver 30 for later processing and playback is available.

As illustrated in FIG. 1, the transmitted pulses are reflected by subsurface interfaces A, B and C (density change borders) similar to seismic acoustic pulses. The reflection of interest is the reflected signal from target D.

There are two primary deficiencies with prior art type of systems. First, due to the great attenuation with depth at the frequencies used in ground penetrating radar applications (50 Mhz to 1000 Mhz), a time-varying gain (logarithmic) is used to amplify the signal. Setting of the amplifier gain is accomplished by adjusting three manual gain controls, surface or shallow gain, mid-range gain, and deep gain. Amplification up to 96 db (64000:1) is available. Using this method of amplification makes it impossible to measure the relative amplitudes of signals from shallow and deep reflectors along the survey line.

The second deficiency is that when exercising the option to digitize and record on tape for later processing, the system digitalization resolution is 8 bits. This resolution is not adequate to realize all of the processing capability. A 12-bit or greater digitalization resolution would be better.

Figure 2:
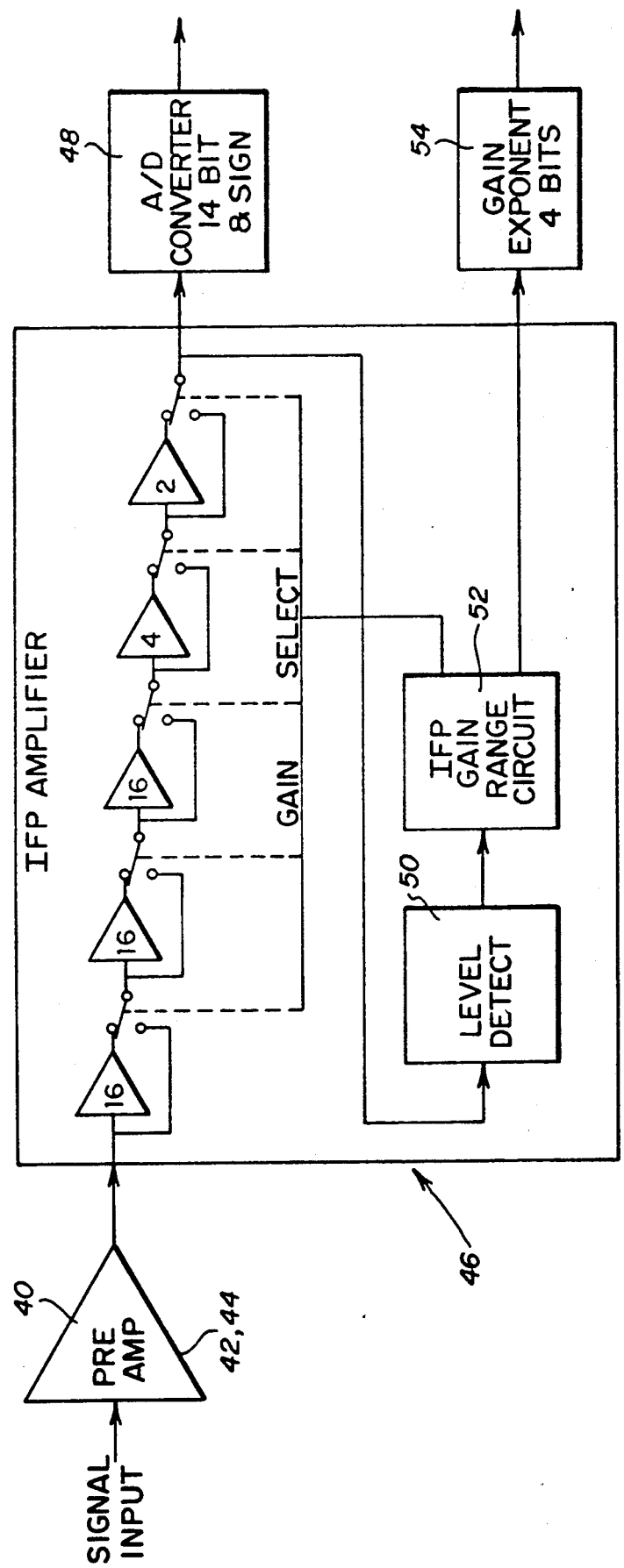
FIG. 2 is a block diagram of an instantaneous floating point amplification circuit.

To overcome the above deficiencies, the present invention provides a method and apparatus for modifying an adapting acquisition hardware commonly used in seismic data acquisition to acquire ground penetrating radar data. The technique by which the present invention operates is referred to as Instantaneous Floating Point (IFP) Amplification. FIG. 2 illustrates the basic concept of the present invention. Reflected signal 26 is input to a preamplifier circuit 40. A switch 42 is used to select gains of 12 db (4:1), 24 db (16:1), 36 db (64:1), and 48 db (256:1). These gains are used to set the base gain of the system. Preamplifier 40 also contains the filtering needed such as the anti-alias filter 44. This signal is then input to instantaneous floating point circuit 46 where the gain is electronically adjusted to bring the signal between one half and full scale on the input to an analog to digital converter 48. Reflected signal 26 is converted to a digital value with a resolution of 15 bits (14 bits and sign) which is adequate for processing. A level detector circuit 50 detects the gain of instantaneous floating point circuit 46 and feeds this information to an instantaneous floating point gain range circuit 52, which is also contained in instantaneous floating point circuit 46. Instantaneous floating point gain range circuit 52 retains the gain used to convert reflected signal 26, and outputs the gain value as a 4-bit gain exponent in circuit 54. The 4-bit exponent represents 90 db (32000:1) of gain in 6 db (2:1) steps. Total system gain of 138 db (8,000,000:1) is available. Each data sample goes through this process and the gain value is recorded as part of that data word. This makes relative amplitude comparison easy.

The hardware of the system is common to seismic acquisition systems, however the timing is modified for a different use of the hardware. With the timing modified, the system can handle ground penetrating radar data instead of basic seismic data. For seismic data the system timing is normally set at a slow rate using twenty-four channels. For radar the system timing is set at a constant fast rate on one channel.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A circuit for processing analog ground penetrating radar signals that have been transmitted through subsurface formations comprising:
    means for receiving the reflected analog radar signals;
    instantaneous floating point amplifier means connected to said receiving means for selecting the analog signal gain of the circuit for processing;
    analog to digital converter connected to said instantaneous floating point amplifier means to convert said analog radar signals to digital signals;
    level detector means for detecting a gain of said instantaneous floating point amplifier means;
    gain range means connected to said level detector means for receiving and retaining said gain; and
    means for converting said gain to an exponent representing said gain.

2. The circuit for processing according to claim 1 wherein, said means for receiving the reflected analog radar signals also includes:
    means for selecting gain for the reflected analog radar signals.

3. The circuit for processing according to claim 1 wherein said means for receiving the reflected analog radar signals also includes:
    means for filtering the reflected analog radar signals.

4. The circuit for processing according to claim 3 wherein said means for filtering the reflected analog radar signals includes an anti-aliasing filter.

5. The circuit for processing according to claim 1 wherein said instantaneous floating point amplifier means includes:
    gain select circuits to electronically adjust the gain to bring the analog reflected radar signal between one half and full scale on the input to said analog to digital converter.

6. A method for processing analog ground penetrating radar signals that have been transmitted through subsurface formations comprising:
    receiving the reflected analog radar signals;
    selecting an analog signal gain;
    converting said analog radar signals to digital signals;
    detecting a gain;
    receiving and retaining said gain; and
    converting said gain to an exponent representing said gain.

7. The method for processing according to claim 6 wherein said step of receiving the reflected analog radar signals also includes the step of:
    selecting gain for the reflected analog radar signals.

8. The method for processing according to claim 6 wherein said step of receiving the reflected analog radar signals also includes the step of:
    filtering the reflected analog radar signals.

9. The method for processing according to claim 8 wherein said step of filtering the reflected analog radar signals includes providing an anti-aliasing filter.

10. The method for processing according to claim 6 wherein said step of selecting an analog signal gain includes the step of:
    adjusting said analog signal gain to bring the analog reflected radar signal between one half and full scale before converting said analog reflected radar signal to a digital signal.

11. A circuit for processing analog ground penetrating radar signals that have been transmitted through subsurface formations comprising:
    means for receiving the reflected analog radar signals having a means for selecting gain for the reflected analog radar signals and means for filtering the reflected analog radar signals including an anti-aliasing filter;
    instantaneous floating point amplifier means connected to said receiving means for selecting the analog signal gain of the circuit for processing having gain select circuits to electronically adjust the gain to bring the analog reflected radar signal between one half and full scale on the input to said analog to digital converter, level detector means for detecting a gain of said instantaneous floating point amplifier means and gain range means connected to said level detector means for receiving and retaining said gain, said gain range means including means for converting said gain to an exponent representing said gain; and
    analog to digital converter connected to said instantaneous floating point amplifier means to convert said analog radar signals to digital signals.

* * * * *